United States Patent
Yang et al.

(10) Patent No.: US 7,855,410 B2
(45) Date of Patent: Dec. 21, 2010

(54) SEMICONDUCTOR MEMORY DEVICES HAVING A FLOATING GATE WITH A PROJECTING PORTION AND METHODS OF FORMING SEMICONDUCTOR MEMORY DEVICES HAVING A FLOATING GATE WITH A PROJECTING PORTION

(75) Inventors: Seung-Jin Yang, Seoul (KR); Jeong-Uk Han, Gyeonggi-do (KR); Yong-Suk Choi, Gyeonggi-do (KR); Hyok-Ki Kwon, Gyeonggi-do (KR); Bae-Seong Kwon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 73 days.

(21) Appl. No.: 12/168,799

(22) Filed: Jul. 7, 2008

(65) Prior Publication Data

US 2009/0008696 A1 Jan. 8, 2009

(30) Foreign Application Priority Data

Jul. 6, 2007 (KR) ...................... 10-2007-0068145

(51) Int. Cl.
*H01L 29/788* (2006.01)
(52) U.S. Cl. ............................. 257/317; 257/E21.206; 257/E21.209; 438/267
(58) Field of Classification Search ......... 257/314–316, 257/E21.206, E21.209, 317; 438/264, 265, 438/267
See application file for complete search history.

(56) References Cited

U.S. PATENT DOCUMENTS

| | | | | |
|---|---|---|---|---|
| 4,935,378 | A | * | 6/1990 | Mori ........................... 438/453 |
| 5,783,473 | A | * | 7/1998 | Sung ........................... 438/265 |
| 6,117,733 | A | * | 9/2000 | Sung et al. ................... 438/265 |
| 6,294,808 | B1 | * | 9/2001 | Yu .............................. 257/317 |
| 6,380,030 | B1 | | 4/2002 | Chen et al. |
| 6,538,277 | B2 | * | 3/2003 | Sung et al. ................... 257/317 |
| 6,656,796 | B2 | * | 12/2003 | Chan et al. ................... 438/266 |
| 6,770,520 | B2 | * | 8/2004 | Chuang et al. .............. 438/197 |
| 2002/0146883 | A1 | * | 10/2002 | Furuhata ...................... 438/257 |
| 2003/0218920 | A1 | * | 11/2003 | Harari ......................... 365/200 |
| 2004/0214396 | A1 | * | 10/2004 | Wang et al. .................. 438/266 |
| 2006/0079054 | A1 | | 4/2006 | Choi et al. |

FOREIGN PATENT DOCUMENTS

| | | |
|---|---|---|
| KR | 10-2006-0031473 | 4/2006 |
| KR | 10-2006-0109738 | 10/2006 |

* cited by examiner

*Primary Examiner*—Wael M Fahmy
*Assistant Examiner*—John C Ingham
(74) *Attorney, Agent, or Firm*—Myers Bigel Sibley & Sajovec, PA

(57) ABSTRACT

According to one embodiment, a semiconductor memory device can be generally characterized as including a gate insulating layer on a semiconductor substrate, a floating gate on the gate insulating layer and a word line disposed on one side of the floating gate. A first side of the floating gate facing the word line may include a projecting portion projecting toward the word line. A tip of the projecting portion may include a corner that extends substantially perpendicularly with respect to a top surface of the semiconductor substrate.

14 Claims, 7 Drawing Sheets

SEMICONDUCTOR MEMORY DEVICES HAVING A FLOATING GATE WITH A PROJECTING PORTION AND METHODS OF FORMING SEMICONDUCTOR MEMORY DEVICES HAVING A FLOATING GATE WITH A PROJECTING PORTION

CROSS-REFERENCE TO RELATED APPLICATIONS

This U.S. non-provisional patent application claims priority under 35 U.S.C. §119 of Korean Patent Application No. 2007-68145, filed on Jul. 6, 2007, the entire contents of which are hereby incorporated by reference.

SUMMARY

Embodiments of the present invention can be generally characterized as relating to semiconductor devices and methods of forming the same, and more particularly, to a nonvolatile semiconductor device and a method of forming the same.

One exemplary embodiment described herein can be generally characterized as a semiconductor memory device that includes: a gate insulating layer on a semiconductor substrate; a floating gate on the gate insulating layer; and a word line disposed on one side of the floating gate. A first side of the floating gate facing the word line may include a projecting portion projecting toward the word line, and a tip of the projecting portion may include a corner that extends substantially perpendicularly with respect to a top surface of the semiconductor substrate.

Another exemplary embodiment described herein can be generally characterized as a semiconductor memory device that includes a floating gate on a semiconductor substrate and a word line on the semiconductor substrate and adjacent to the side surface of the floating gate. The floating gate may include a top surface, a bottom surface and a side surface connecting the top surface and the bottom surface. A distance between a first portion of the side surface of the floating gate and the word line along a direction may be less than a distance between a second portion of the side surface of the floating gate and the word line along the direction.

Another exemplary embodiment described herein can be generally characterized as a method of forming a nonvolatile memory device that includes forming a gate insulating layer on a semiconductor substrate, forming a floating gate on the gate insulating layer, and forming a word line on one side of the floating gate. A first side of the floating gate facing the word line includes a projecting portion projecting toward the word line, and a tip of the projecting portion includes a corner substantially perpendicular to a top surface of the semiconductor substrate.

BRIEF DESCRIPTION OF THE FIGURES

The accompanying figures are included to provide a further understanding of the exemplary embodiments of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
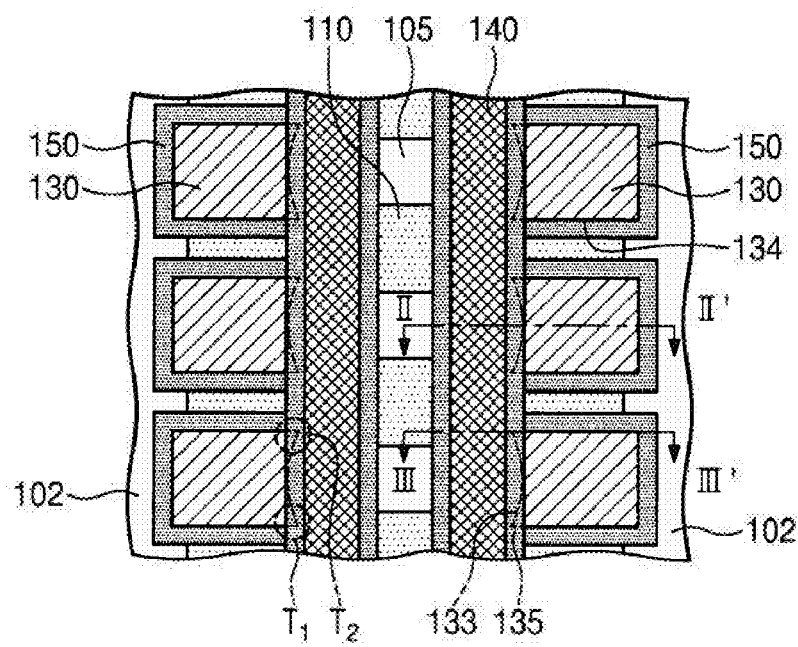
FIGS. 1 to 3B illustrate a nonvolatile memory device in accordance with exemplary embodiments of the present invention.
Figure 2:
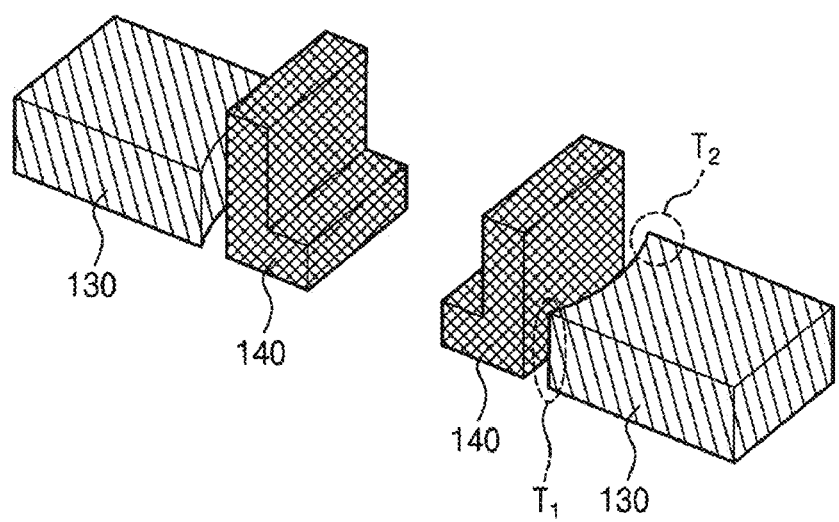

Exemplary embodiments of the present invention will be described more fully hereinafter with reference to the accompanying drawings. These embodiments may, however, be realized in many different forms and should not be construed as limited to the embodiments set forth herein. Rather, these embodiments are provided so that this disclosure will be thorough and complete, and will fully convey the scope of the invention to those skilled in the art. In the drawings, the device size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which the embodiments of this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Figure 3A:
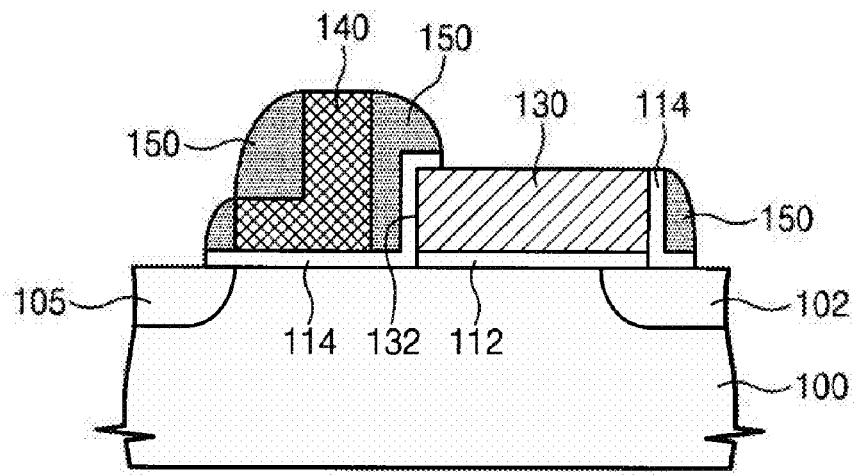
Figure 3B:
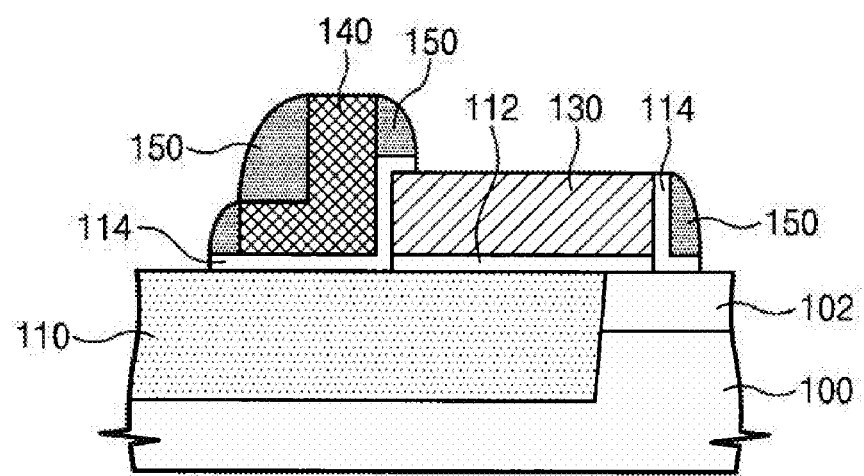

FIGS. 1 to 3B illustrate a semiconductor memory device (e.g., a nonvolatile memory device) in accordance with exemplary embodiments of the present invention. FIG. 3A is a cross-sectional view taken along the line II-II' of FIG. 1. FIG. 3B is a cross-sectional view taken along the line III-III' of FIG. 1.

Referring to FIGS. 1 to 3B, a device isolation layer 110 that defines an active region is provided in a semiconductor substrate 100. A gate insulating layer 112 is disposed on the active region. The gate insulating layer 112 may include a material such as silicon oxide. A floating gate 130 is disposed on the gate insulating layer 112. The floating gate 130 may include a material such as polysilicon. The floating gate 130 may store electrons. A word line 140 can be disposed to be adjacent to one side of the floating gate 130. A first side 132 of the floating gate 130 facing the word line 140 includes a projecting portion (e.g., a portion which when seen in plan view projects laterally towards the word line 140). A tip of the projecting portion includes a corner that extends substantially perpendicularly with respect to a top surface of the semiconductor substrate 100. A drain region 105 is disposed in the active region between the word lines 140 and a common source region 102 is disposed in the active region adjacent to the floating gate 130.

The word line 140 may be disposed so as to not cover the floating gate 130. A cross-section of the word line 140 may have an L shape. A height of the word line 140 may be greater than a height of the floating gate 130. Since the height of the word line 140 is greater than the height of the floating gate 130, electrons may be easily ejected from the projecting portion during an erase operation. That is, an electric field may be concentrated on the tips of the projecting portion.

The projecting portion may include a first projecting portion T1 and a second projecting portion T2. The first projecting portion T1 is disposed on one edge of the first side 132 of the floating gate 130 and the second projecting portion T2 is disposed on the other edge of the first side 132 of the floating gate 130. Each of the first and second projecting portions T1 and T2 may have a gradually narrowing width as the first and second projecting portions T1 and T2 approach the word line 140, forming the tips of each of the first and second projecting portions T1 and T2. The first side 132 of the floating gate 130 that connects the first projecting portion T1 and the second projecting portion T2 may have a curved surface. The floating gate 130 may have a second side 134 facing an adjacent floating gate 130. The first projecting portion T1 and the second projecting portion T2 each include a first surface 133 and a second surface 135. The first surface 133 extends from the curved surface, and the second surface 135 extends from the second side 134 to meet the first surface 133. The corner may be defined as a line segment formed where the first and second surfaces 133 and 135 meet.

As described above, first and second projecting portions T1 and T2 are disposed on the first side 132 of the floating gate 130. However, projecting portions of various shapes having an acute angle may be disposed on the first side 132 of the floating gate 130. In one embodiment, one projecting portion having a tip may be disposed substantially at the middle of the first side 132 of the floating gate 130.

A gate insulating layer 114 is interposed between the word line 140 and the floating gate 130. The gate insulating layer 114 may include a material such as silicon oxide. The gate insulating layer 114 may include a material such as aluminum oxide, hafnium oxide, or oxide layer-nitride layer-oxide. A spacer 150 is disposed on sidewall of the word line 140 and the sidewall of the floating gate 130. The spacer 150 may include a material such as silicon nitride. The spacer 150 and the gate insulating layer 114 may be interposed between the word line 140 and the first side 132 of the floating gate 130.

During an erase operation, electrons stored in the floating gate 130 may flow into the word line 140 through the projecting portion of the floating gate 130. Since the projecting portion has two tips, an efficiency of an erase operation may be improved. Since the word line 140 is disposed so as to not cover the floating gate 130, a uniformity of a cell unit may be obtained.

FIGS. 4A to 8B are drawings illustrating a method of forming a semiconductor memory device (e.g., a nonvolatile memory device) in accordance with exemplary embodiments of the present invention. FIGS. 4B to 8B are cross-sectional views taken along the respective lines IV-IV' of FIGS. 4A to 8A.

Figure 4A:
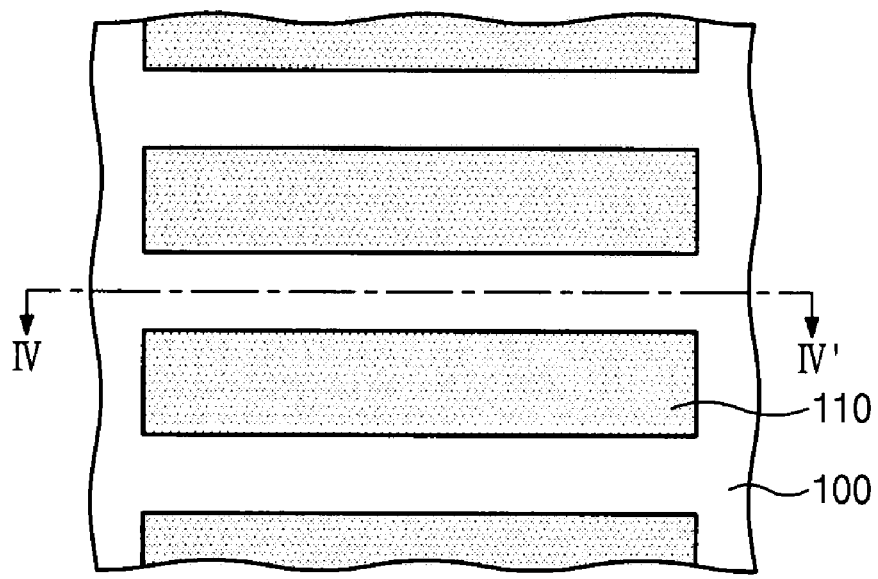
FIGS. 4A to 8B illustrate a method of forming a nonvolatile memory device in accordance with exemplary embodiments of the present invention.
Figure 4B:
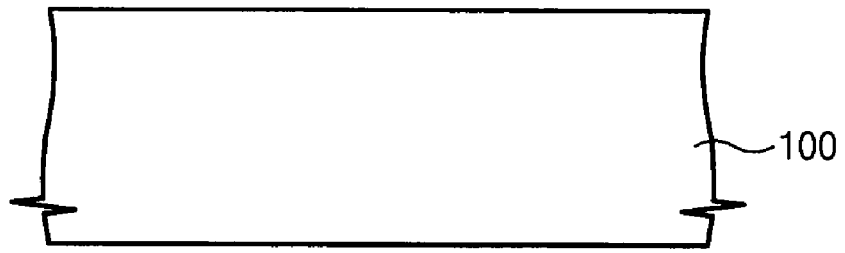

Referring to FIGS. 4A and 4B, a device isolation layer 110 that defines an active region is formed in a semiconductor substrate 100. The device isolation layer 110 may be formed using a shallow trench isolation method (e.g., by forming a trench in the semiconductor substrate 100 and forming an insulating layer that fills the trench).

Figure 5A:
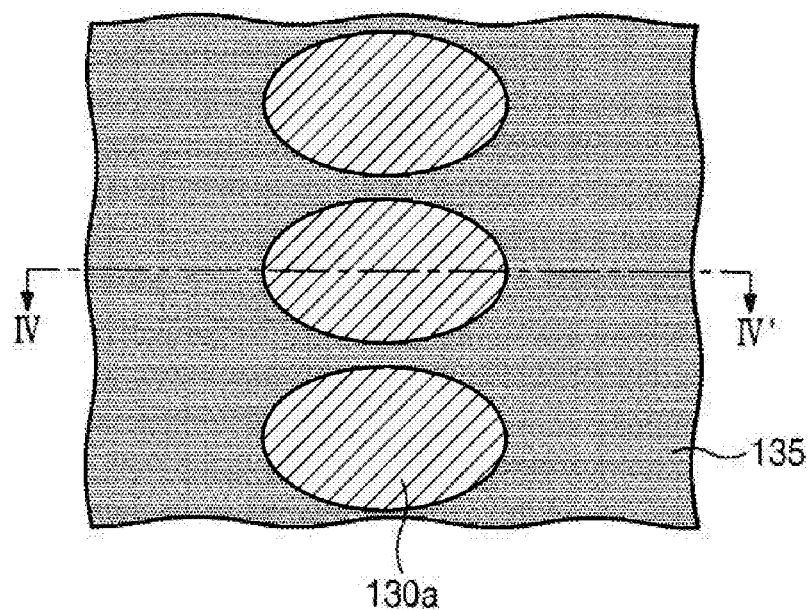
Figure 5B:
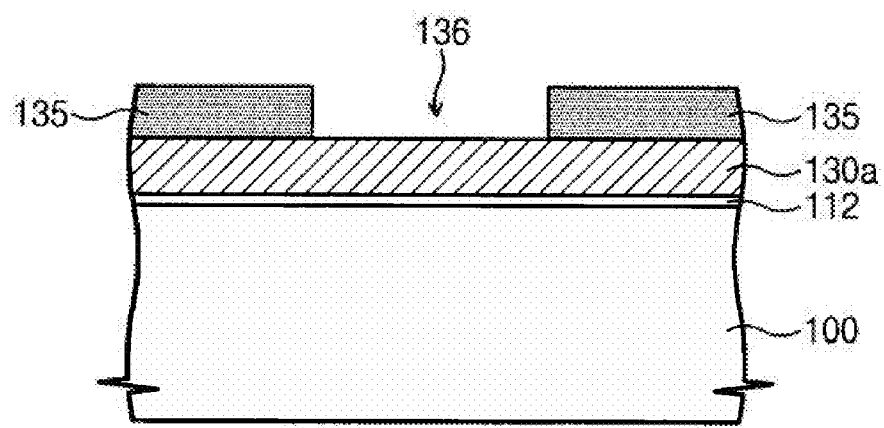

Referring to FIGS. 5A and 5B, a gate insulating layer 112 is formed on the active region. The gate insulating layer 112 may be formed using a thermal oxidation process or a chemical vapor deposition method. A first preliminary floating gate layer 130a is formed on the gate insulating layer 112. The first preliminary floating gate layer 130a may include a material such as polysilicon. A first photoresist pattern 135 including a first opening 136 is formed on the first preliminary floating gate layer 130a. The first opening 136 may be formed to have an oval, a circle, a square-shaped configuration, or the like.

Figure 6A:
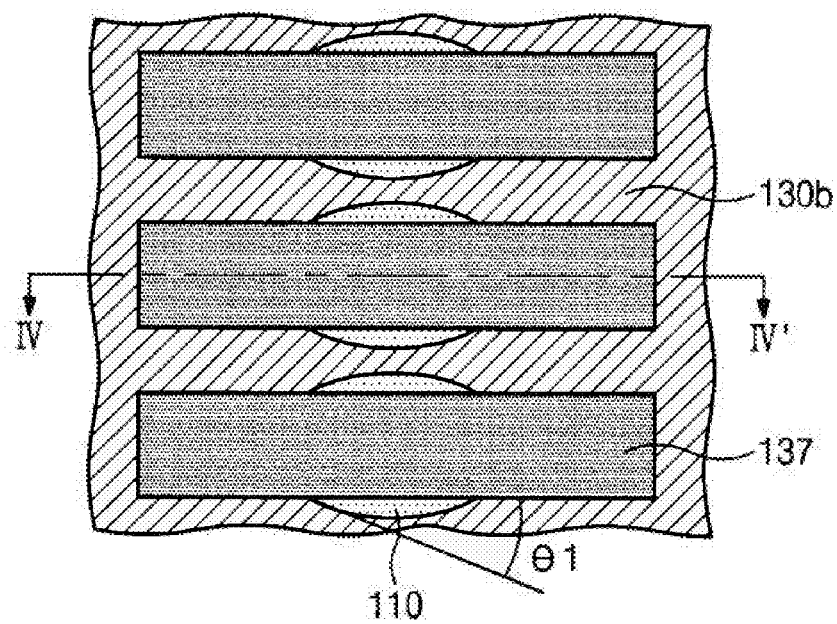
Figure 6B:
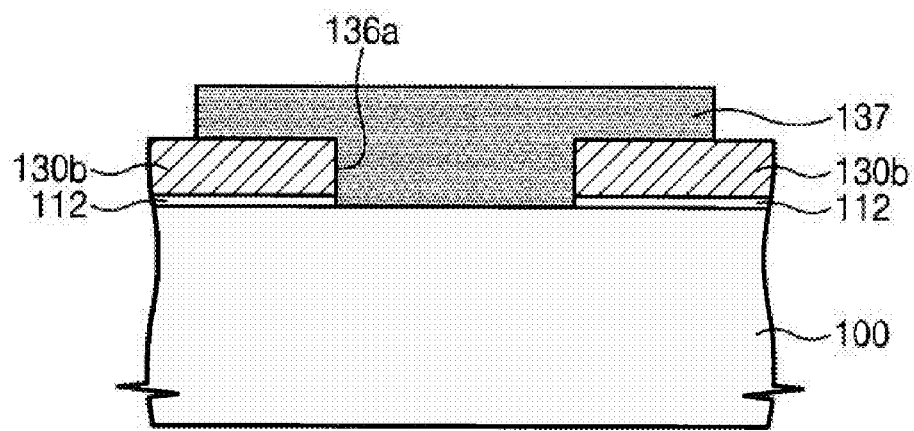

Referring to FIGS. 6A and 6B, the first preliminary floating gate layer 130a is etched using the first photoresist pattern 135 as a mask to form a second preliminary floating gate layer 130b. The first photoresist pattern 135 is removed. The second preliminary floating gate layer 130b may include a second opening 136a which is substantially the same shape as the first opening 136. A second photoresist pattern 137 crosses the second opening 136a and extends toward a first direction. The second photoresist pattern 137 of the first direction and a side surface of the second opening 136a cross each other to form an acute angle θ1.

Figure 7A:
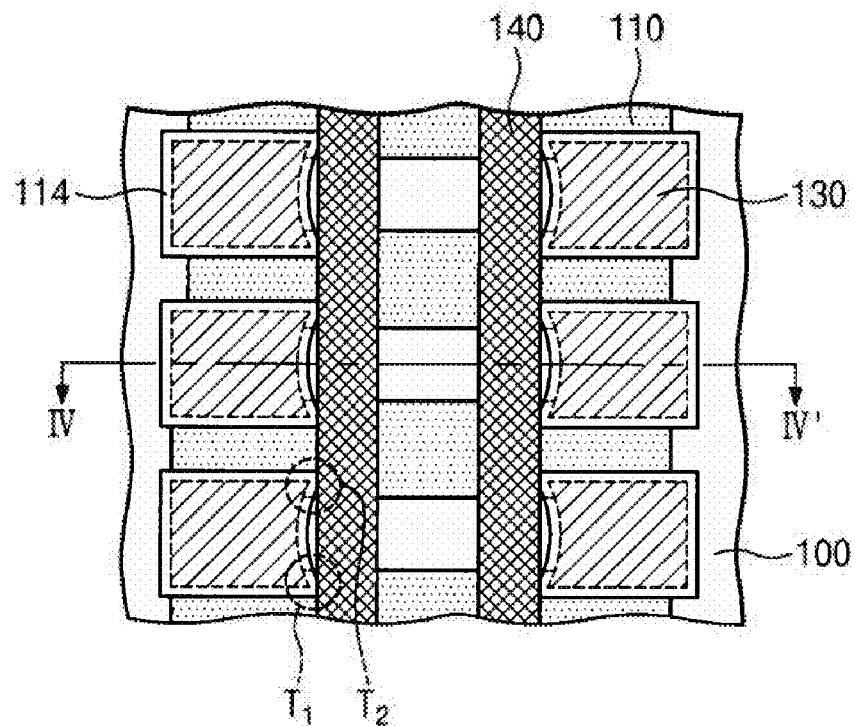
Figure 7B:
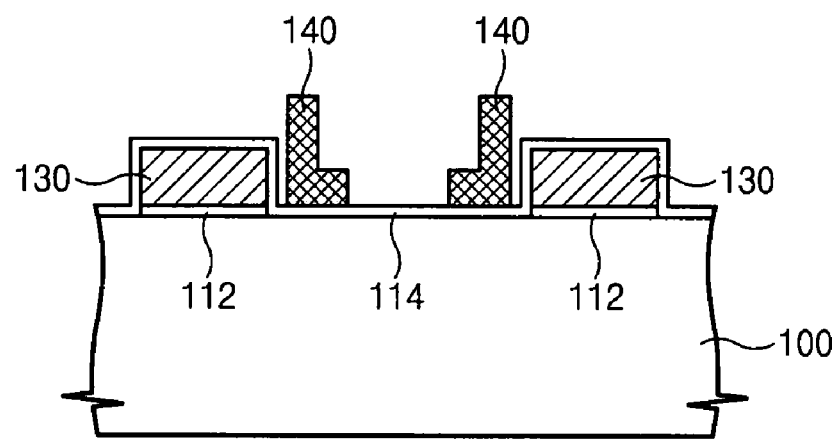

Referring to FIGS. 7A and 7B, the second preliminary floating gate layer 130b is etched using the second photoresist pattern 137 as a mask to form a floating gate 130. After the second photoresist pattern 137 is removed, an intergate insulating layer 114 which covers the floating gate 130 and the semiconductor substrate 100 is formed. The intergate insulating layer 114 may include a material such as silicon oxide and may be formed using a thermal oxidation process or a chemical vapor deposition method. The intergate insulating layer 114 may include a material such as oxide layer-nitride layer-oxide, aluminum oxide, hafnium oxide, or zirconium oxide.

A word line 140 is formed on one side of the floating gate 130. The word line 140 may include a material such as polysilicon. A height of the word line 140 may be higher than a height of the floating gate 130. A first side 132 of the floating gate 130 facing the word line 140 may include a projecting portion, and a tip of the projecting portion may include a corner that extends substantially perpendicularly with respect to an upper surface of the semiconductor substrate 100.

The projecting portion may include a first projecting portion T1 and a second projecting portion T2. The first projecting portion T1 is disposed on one edge of the first side 132 of the floating gate 130 and the second projecting portion T2 is disposed on the other edge of the first side 132 of the floating gate 130. Each of the first and second projecting portions T1 and T2 may have gradually narrowing width as the first and second projecting portions T1 and T2 approach the word line 140 to form the tips of each of the first and second projecting portions T1 and T2. An erase operation of the nonvolatile memory device may include that electrons stored in the floating gate 130 are injected into the word line 140 through the projecting portion.

Figure 8A:
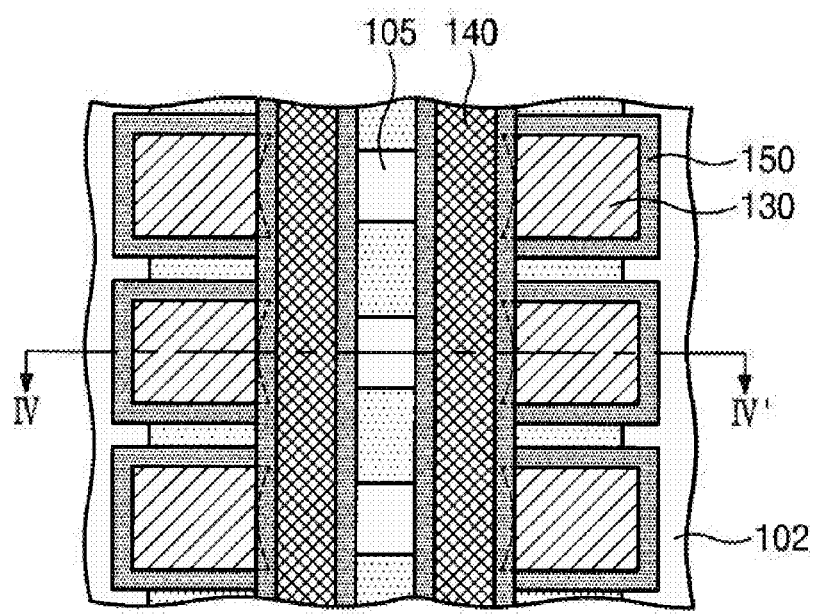
Figure 8B:
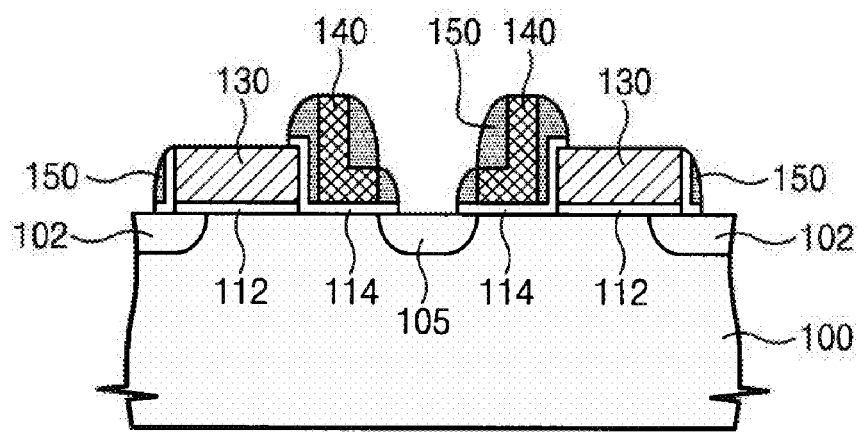

Referring to FIGS. 8A and 8B, a spacer 150 is formed on a sidewall of the word line 140 and a sidewall of the floating gate 130. The spacer 150 may be formed of a material such as silicon nitride. The spacer 150 may be interposed between the first side 132 and the word line 140 during the formation of the spacer 150. As a result, only the intergate insulating layer 114 may be interposed between the word line 140 and the side of the projecting portion of the first side 132, and the intergate insulating layer 114 and the spacer 150 may be formed between the word line 140 and the middle of the first side 132.

As shown above, embodiments of the present invention may be practiced in many ways. What follows in the paragraphs below is a non-limiting description of some example embodiments.

One embodiment exemplarily described herein can be generally characterized as a method of forming a semiconductor memory device. The method may, for example, include forming a gate insulating layer on a semiconductor substrate; forming a floating gate on the gate insulating layer; and forming a word line on one side of the floating gate, wherein a first side of the floating gate facing the word line includes a projecting portion projecting toward the word line, and a tip of the projecting portion includes a corner substantially perpendicular to a top surface of the semiconductor substrate.

In one embodiment, the word line may be formed so as to not cover the floating gate. A height of the word line may be greater than a height of the floating gate.

In one embodiment, forming the floating gate may comprise forming a device isolation layer that defines an active region in the semiconductor substrate; forming a preliminary floating gate including an opening; forming a photoresist pattern that extends toward a first direction and crosses the opening on the active region; and etching the preliminary floating gate using the photoresist pattern as a mask, wherein an angle that the photoresist pattern of the first direction and a side surface of the opening cross each other is an acute angle. The opening may be formed to have an oval shape, a circle shape, or the like.

In one embodiment, the projecting portion may include a first projecting portion disposed on one edge of the first side and a second projecting portion disposed on the other edge of the first side. The first and second projecting portions may have gradually narrowing width as each approach the word line.

In one embodiment, an intergate insulating layer may be formed of material such as silicon oxide. A spacer may be formed on a sidewall of the word line and a sidewall of the floating gate. The spacer may be formed of a material such as silicon nitride, wherein the intergate insulating layer and the spacer are interposed between the word line and the first side.

While exemplary embodiments of the present invention have been particularly shown and described above, it will be understood by one skilled in the art that various changes in form and details may be made therein without departing from the spirit and scope of the invention as defined by the appended claims.

What is claimed is:

1. A semiconductor memory device, comprising:
   a gate insulating layer on a semiconductor substrate;
   a floating gate on the gate insulating layer;
   a word line disposed on one side of the floating gate;
   an intergate insulating layer interposed between the word line and the floating gate; and
   a spacer disposed on a sidewall of the word line and a sidewall of the floating gate,
   wherein the intergate insulating layer and the spacer include different materials, and
   wherein the floating gate includes a projecting portion projecting toward the word line, the projecting portion defining one end of an arc that lies in a plane parallel to a top surface of the floating gate.

2. The device of claim 1, wherein the word line is disposed so as to not overlap the top surface of the floating gate.

3. The device of claim 2, wherein a height of the word line is greater than a height of the floating gate.

4. The device of claim 1, wherein the projecting portion includes a first projecting portion disposed on a first corner of the top surface of the floating gate and a second projecting portion disposed on a second corner of the top surface of the floating gate.

5. The device of claim 4, wherein each of the first and second projecting portions includes gradually narrowing width as each approach the word line.

6. The device of claim 4, wherein one edge of the top surface of the floating gate connects the first and second projecting portions and has a concavely curved surface.

7. The device of claim 1, wherein the intergate insulating layer includes silicon oxide.

8. The device of claim 1, wherein the spacer includes silicon nitride, wherein the intergate insulating layer and the spacer are interposed between the word line and the sidewall of the floating gate.

9. A semiconductor memory device, comprising:
   a floating gate on a semiconductor substrate, the floating gate including a top surface, a bottom surface and a side surface connecting the top surface and the bottom surface;
   a word line on the semiconductor substrate and adjacent to the side surface of the floating gate;
   an intergate insulating layer interposed between the word line and the floating gate; and
   a spacer disposed on a sidewall of the word line and the side surface of the floating gate,
   wherein the intergate insulating layer and the spacer include different materials, and
   wherein a distance between the side surface of the floating gate and the word line varies along an arc connecting first and second portions of the side surface of the floating gate, the arc lying in a plane parallel to the top surface of the floating gate.

10. The device of claim 9, wherein arc is concavely curved.

11. The device of claim 10, wherein a side surface of the word line facing the side surface of the floating gate is substantially planar.

12. A method of forming a nonvolatile memory device, comprising:
   forming a gate insulating layer on a semiconductor substrate;
   forming a floating gate on the gate insulating layer;
   forming a word line on one side of the floating gate;

forming an intergate insulating layer interposed between the word line and the floating gate; and forming a spacer disposed on a sidewall of the word line and a sidewall of the floating gate, wherein the intergate insulating layer and the spacer include different materials, and wherein the floating gate includes a projecting portion projecting toward the word line, the projecting portion defining one end of an arc that lies in a plane parallel to a top surface of the floating gate.

13. A method of forming a nonvolatile memory device, comprising:

forming a gate insulating layer on a semiconductor substrate;

forming a floating gate on the gate insulating layer; and forming a word line on one side of the floating gate, wherein forming the floating gate comprises:

forming a device isolation layer that defines an active region in the semiconductor substrate;

forming a preliminary floating gate including an opening;

forming a photoresist pattern that extends toward a first direction and crosses the opening on the active region; and etching the preliminary floating gate using the photoresist pattern as a mask, wherein an angle that the photoresist pattern of the first direction and a side surface of the opening cross each other is an acute angle.

14. The method of claim 13, wherein the opening is formed to have an oval shape or a circle shape.

\* \* \* \* \*